United States Patent
Li et al.

(10) Patent No.: US 9,785,371 B1
(45) Date of Patent: Oct. 10, 2017

(54) POWER-REDUCING MEMORY SUBSYSTEM HAVING A SYSTEM CACHE AND LOCAL RESOURCE MANAGEMENT

(71) Applicant: QUALCOMM INCORPORATED, San Diego, CA (US)

(72) Inventors: Yanru Li, San Diego, CA (US); Dexter Tamio Chun, San Diego, CA (US); Alain Artieri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 16 days.

(21) Appl. No.: 15/081,915

(22) Filed: Mar. 27, 2016

(51) Int. Cl.
*G06F 1/32* (2006.01)
*G06F 3/06* (2006.01)
*G06F 12/0862* (2016.01)
*G11C 11/406* (2006.01)

(52) U.S. Cl.
CPC .......... *G06F 3/0625* (2013.01); *G06F 1/3275* (2013.01); *G06F 3/0611* (2013.01); *G06F 3/0653* (2013.01); *G06F 3/0685* (2013.01); *G06F 12/0862* (2013.01); *G11C 11/40607* (2013.01); *G06F 2212/1021* (2013.01); *G06F 2212/1024* (2013.01); *G06F 2212/222* (2013.01); *G06F 2212/602* (2013.01); *Y02B 60/1225* (2013.01)

(58) Field of Classification Search
CPC ...... G06F 1/3225; G06F 1/324; G06F 1/3275; G06F 1/3296; G06F 2212/1028; G06F 2212/502; G06F 2212/6012; Y02B 60/1217; Y02B 60/1225; Y02B 60/1285
See application file for complete search history.

(56) References Cited

U.S. PATENT DOCUMENTS

| 5,860,106 A | 1/1999 | Domen et al. |
| 6,334,167 B1 | 12/2001 | Gerchman et al. |
| 8,339,891 B2 | 12/2012 | Arntzen et al. |
| 8,589,707 B2 | 11/2013 | Subramanian et al. |
| 8,656,198 B2 | 2/2014 | Branover et al. |

(Continued)

OTHER PUBLICATIONS

Lin, Jiang, et al. "DRAM-level prefetching for fully-buffered DIMM: Design, performance and power saving." Performance Analysis of Systems & Software, 2007. ISPASS 2007. IEEE International Symposium on. IEEE, 2007.*

(Continued)

*Primary Examiner* — Nicholas Simonetti
(74) *Attorney, Agent, or Firm* — Smith Tempel Blaha LLC/Qualcomm

(57) ABSTRACT

Systems, methods, and computer programs are disclosed for method for reducing memory subsystem power. In an exemplary method, a system resource manager provides memory performance requirements for a plurality of memory clients to a double data rate (DDR) subsystem. The DDR subsystem and the system resource manager reside on a system on chip (SoC) electrically coupled to a dynamic random access memory (DRAM). A cache hit rate is determined of each of the plurality of memory clients associated with a system cache residing on the DDR subsystem. The DDR subsystem adjusts access to the DRAM based on the memory performance requirements received from the system resource manager and the cache hit rates of the plurality of memory clients.

30 Claims, 8 Drawing Sheets

(56) References Cited

U.S. PATENT DOCUMENTS

| | | | |
|---|---|---|---|
| 8,713,256 B2 | 4/2014 | Sodhi et al. | |
| 2006/0248533 A1* | 11/2006 | Inari | G06F 9/5038 |
| | | | 718/103 |
| 2007/0043965 A1 | 2/2007 | Mandelblat et al. | |
| 2008/0005607 A1 | 1/2008 | Fukatsu | |
| 2009/0204837 A1 | 8/2009 | Raval et al. | |
| 2011/0320839 A1 | 12/2011 | David et al. | |
| 2012/0095607 A1 | 4/2012 | Wells et al. | |
| 2012/0185651 A1* | 7/2012 | Kimori | G06F 12/0862 |
| | | | 711/137 |

OTHER PUBLICATIONS

Howard D., et al., "Memory Power Management Via Dynamic Voltage/Frequency Scaling", Proceedings of the 8th ACM International Conference on Autonomic Computing, ACM, 2011, pp. 31-40.

Papathanasiou E., et al., "Energy Efficient Prefetching and Caching Athanasios," Proceedings of the 2004 USENIX Annual Technical Conference, Jun. 27-Jul. 2, 2004; 28 pages.

* cited by examiner

| MASTER ID | PREFETCH WEIGHTING | ACCESS PATTERN | DELAY TOLERANCE (ns) |
|---|---|---|---|
| CAMERA 310 | 10 | STRIDE (e.g., read 64B, skip 192b) | x |
| GPU 312 | 5 | contiguous | y |
| CPU 314 | 0 | | z |

FIG. 3

POWER-REDUCING MEMORY SUBSYSTEM HAVING A SYSTEM CACHE AND LOCAL RESOURCE MANAGEMENT

DESCRIPTION OF THE RELATED ART

Portable computing devices (e.g., cellular telephones, smart phones, tablet computers, portable digital assistants (PDAs), portable game consoles, wearable devices, and other battery-powered devices) and other computing devices continue to offer an ever-expanding array of features and services, and provide users with unprecedented levels of access to information, resources, and communications. To keep pace with these service enhancements, such devices have become more powerful and more complex. Portable computing devices now commonly include a system on chip (SoC) comprising a plurality of memory clients embedded on a single substrate (e.g., one or more central processing units (CPUs), a graphics processing unit (GPU), digital signal processors, etc.). The memory clients may read data from and store data in a dynamic random access memory (DRAM) memory system electrically coupled to the SoC via a double data rate (DDR) bus.

DDR system power is increasingly becoming a significant portion of total battery usage. Most of the DDR system power is a result of the read/write traffic to the DRAM. As systems become more complex, they demand higher traffic bandwidth and the traffic patterns become more complex and random, yielding increasing energy expenditure. Incorporating a last-level system cache may reduce the amount of DDR traffic. However, even with the benefit provided by the system cache, the DDR subsystem may still waste power because it must operate at a worst-case voltage and frequency required to service the unpredictable traffic. Existing solutions attempt to conserve DDR power by using an open-loop adjustment of the DDR clock frequency. These solutions, however, are sub-optimal because the adjustment must be conservative to avoid performance drops. While there is some power savings, further adjustments may compromise the end-user experience.

Accordingly, there is a need for improved systems and methods for reducing memory subsystem power.

SUMMARY OF THE DISCLOSURE

Systems, methods, and computer programs are disclosed for reducing memory subsystem power. In an exemplary method, a system resource manager provides memory performance requirements for a plurality of memory clients to a double data rate (DDR) memory subsystem. The DDR subsystem and the system resource manager reside on a system on chip (SoC) electrically coupled to a dynamic random access memory (DRAM). A cache hit rate is determined of each of the plurality of memory clients associated with a system cache residing on the DDR subsystem. The DDR subsystem adjusts access to the DRAM based on the memory performance requirements received from the system resource manager and the cache hit rates of the plurality of memory clients.

Another embodiment of a system for reducing memory subsystem power comprises a dynamic random access memory (DRAM) and a system on chip (SoC) electrically coupled to the DRAM via a DDR bus. The SoC comprises a plurality of memory clients electrically coupled via a SoC bus, a system resource manager, and a DDR subsystem. The system resource manager is configured to determine memory performance requirements for the plurality of memory clients. The DDR subsystem comprises a system cache. The DDR subsystem is configured to: determine a cache hit rate of each of the plurality of memory clients associated with the system cache; and adjust access to the DRAM based on the memory performance requirements received from the system resource manager and the cache hit rates of the plurality of memory clients.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 3 is a table illustrating an exemplary embodiment of a method for adjusting prefetch size based on predetermined use cases.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
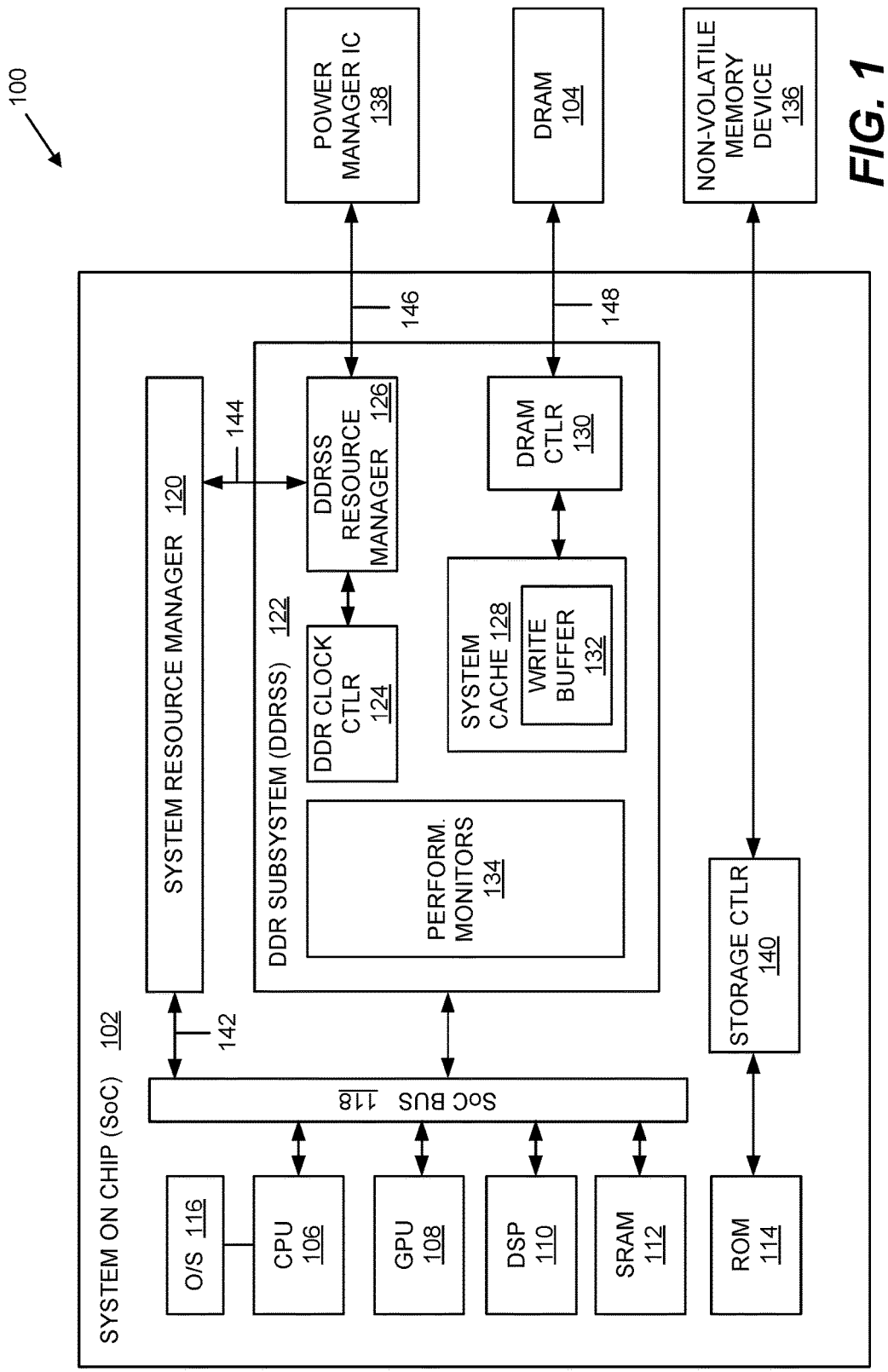
FIG. 1 is a block diagram of an embodiment of a system for reducing memory subsystem power.

FIG. 1 illustrates an embodiment of a system 100 for reducing memory subsystem power. The system 100 may be implemented in any computing device, including a personal computer, a workstation, a server, or a portable computing device (PCD), such as a cellular telephone, a smart phone, a portable digital assistant (PDA), a portable game console, a tablet computer, or other battery-powered wearable device.

As illustrated in FIG. 1, the system 100 comprises a system on chip (SoC) 102 electrically coupled to a memory system via a memory bus. In the embodiment of FIG. 1, the memory system comprises a dynamic random access memory (DRAM) 104 coupled to the SoC 102 via a random access memory (RAM) bus 148 (e.g., a double data rate (DDR) bus). The SoC 102 comprises various on-chip components, including a plurality of memory clients, a storage controller 140, a system resource manager 120, and a memory subsystem (e.g., DDR subsystem 122) interconnected via a SoC bus 118. The memory clients may comprise one or more processing units (e.g., a central processing unit (CPU) 106, a graphics processing unit (GPU) 108, a digital signal processor (DSP) 110, or other memory clients requesting read/write access to the memory system. The system 100 further comprises a high-level operating system (HLOS) 116.

The storage controller 140 controls the transfer of data to a storage device, such as, a non-volatile memory device 136. As further illustrated in FIG. 1, the SoC 102 may comprise on-chip memory devices, such as, static random access memory (SRAM) 112 and read only memory (ROM) 114.

As described below in more detail, the system 100 provides an improved architecture for enabling the DDR subsystem 122 to integrate complex memory traffic patterns and control the DDR clock frequency and/or voltage level to provide the overall performance requirements for various use cases. In operation, each of the memory clients may send a performance level vote to the system resource manager 120 via an interface 142. As known in the art, the client votes indicate a desired memory bandwidth capability to the DDR subsystem 122. The system resource manager 120 comprises various functional blocks for managing system resources, such as, for example, clocks, voltage regulators, bus frequencies, quality of service, priority, etc. The system resource manager 120 enables each component in the system 100 to vote for the state of system resources. The system resource manager 120 may combine all of the client votes and estimate use case performance requirements. The system resource manager 120 may forward the use case performance requirements to the DDR subsystem 122 via interface 144. The DDR subsystem 122 controls its own clock frequency and voltage based on various local conditions under its control.

As illustrated in FIG. 1, the DDR subsystem 122 comprises a local DDRSS resource manager 126 that receives the use case performance requirements from the system resource manager 120. In an embodiment, the local DDRSS resource manager 126 comprises a hardware block within the DDR subsystem. It should be appreciated that the local DDRSS resource manager 126 may comprise one or more functions implemented by, for example, one or more blocks within the DDR subsystem 122. The local DDRSS resource manager 126 may control the DDR frequency via DDR clock controller 124. The local DDRSS resource manager 126 may control the DDR voltage by communicating with a power manager integrated circuit (IC) 138 electrically coupled to the SoC 102 via a connection 146. In an embodiment, the DDR frequency and/or voltage may be adjusted based on the performance requirements of the memory clients and the cache hit rate of each client.

As further illustrated in FIG. 1, the DDR subsystem 122 may comprise a system cache 128, one or more cache performance monitors 134, and a DRAM controller 130. The system cache 128 is electrically coupled to the DRAM controller 130. The DRAM controller 130 is electrically coupled to the off-chip DRAM 104 via the RAM bus 148. The system cache 128 may comprise a shared or last-level cache comprising a write buffer 132. The system cache 128 is a component that stores data so future requests for that data can be served faster. In an embodiment, the system cache 128 may reside externally outside of the SoC 102 and connect to the SoC 102 via an I/O bus.

In another embodiment, the DDR subsystem 122 may control the DDR voltage and/or frequency based on client-specific performance monitors 134 and/or the cache hit rate of each memory client. It should be appreciated that the clock frequency and voltage of the DDR and the system cache 128 may be separately controlled. As described below in more detail, the DDR subsystem 122 may use the write buffer 132 to aggregate and more effectively schedule write access to DRAM 104. Furthermore, the DDR subsystem 122 may apply various cache prefetch policies to aggregate read access and mitigate latency when DRAM 104 is operating at relatively low frequency (e.g., below a predetermined or programmable level).

It should be appreciated that DDR subsystem 122 may use the cache hit rates together with the client votes as input elements for calculation of the DDR clock frequency and, thereby, maintain the DDR clock frequency at a more optimal level. Furthermore, reducing the clock frequency also allows the voltage to be reduced, which results in an overall energy savings.

Figure 2:
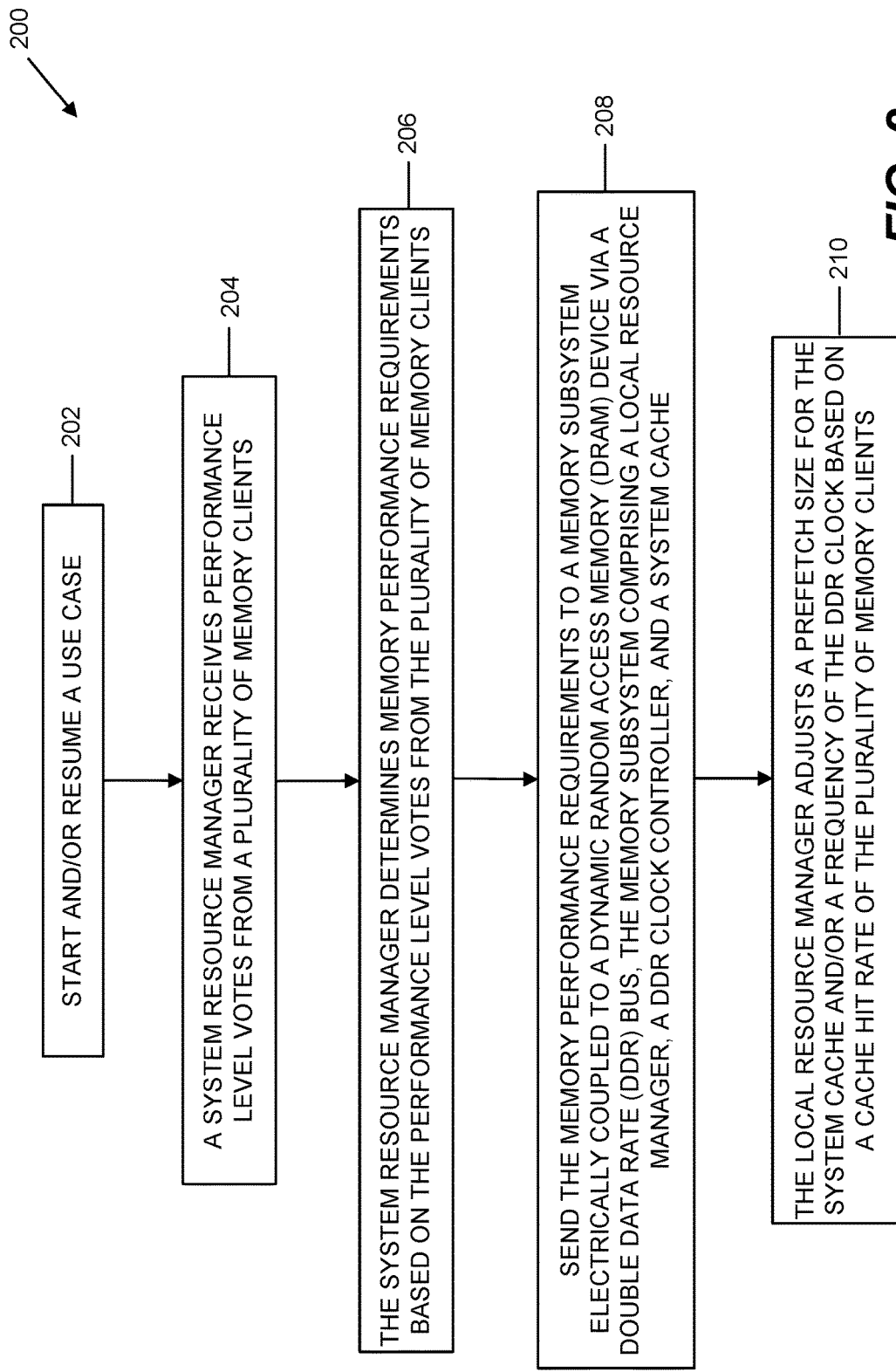
FIG. 2 is a flowchart illustrating an embodiment of a method for reducing power consumption of the DDR subsystem of FIG. 1.

FIG. 2 is a flowchart illustrating an embodiment of a method 200 implemented in system 100 for adjusting the DDR frequency. The method 200 may be performed for various different use cases. At block 202, a use case may be initiated or resumed. At block 204, the system 100 may initially have default frequency and/or voltage levels for the system cache 128 and DRAM 104. The system resource manager 120 receives initial performance level votes from the memory clients (e.g., CPU 106, GPU 108, DSP 110, etc.). At block 206, the system resource manager 120 determines memory performance requirements based on the performance level votes received from the memory clients. In an embodiment, the system resource manager 120 estimates the performance requirements. The system resource manager 120 may use quality of service (QoS) information to update the performance estimates. At block 208, the memory performance requirements are sent to the DDR subsystem 122. The memory performance requirements may be forwarded to the local DDRSS resource manager 126 via interface 144 (FIG. 1.). At block 210, the local DDRSS resource manager 126 may calculate and adjust the frequency and/or voltage for the DDR clock controller 124 and the system cache 128 based on the cache hit rates of the memory clients. As mentioned above, the cache hit rates may be determined by one or more performance monitors 134. The local DDRSS resource manager 126 may also adjust a system cache prefetch size based on the cache hit rates and the memory performance requirements. In an exemplary embodiment, the clock frequency for each of a plurality of memory clients (e.g., client 0-client n) may be assigned a predetermined weight (Wn). The predetermined weights (Wn) may be pre-calibrated for each client with a unique bandwidth requirement (BWn) and a hit rate (HRn). The total bandwidth requirement to the system cache 128 comprises a sum of all clients' bandwidth requirements (BWn) normalized by the corresponding client's weight and cache hit rate. The system cache frequency may be determined by dividing the system cache's total bandwidth requirement by the width of the system cache's data path.

The DDR frequency may be calculated in a similar manner by the cache miss rate instead of the cache hit rate, as shown in Equations 1 and 2 below.

$$F\_cache = \text{sum}(W0*BW0*HR0 + W1*BW1*HR1 + \ldots + Wn*BWn*HRn)/\text{interface\_width} \quad \text{Equation 1}$$

$$F\_ddr = \text{sum}(W0*BW0*(1-HR0) + W1*BW1*(1-HR1) + \ldots + Wn*BWn*(1-HRn))/\text{interface\_width} \quad \text{Equation 2}$$

In Equations 1 and 2, "Wn" represents the relative importance or weight of each client in the frequency decision making. For example, a larger value of Wn may cause that particular client's bandwidth requirement to have a greater influence on the frequency compared to other clients with a lower value of Wn. The sum of all Wn values is 100%. In an embodiment, for a given type of use case, the weighting distribution across all clients may follow a predetermined profile. Changing between use-case types may involve an adjustment of the weighting distribution. "BWn" represents the unique bandwidth requirement for that client, which may be measured in bytes/second. The bandwidth requirement may continually change even within the same use-case. "HRn" represents the system cache hit rate measured for that client and can take values from 0 to 100%. The hit rate may change, even within the same use-case. The value of (1−HRn) comprises the system cache miss rate for that client. "Interface_width" represents the number of bytes transferred in a single clock period of 1/F_cache or 1/F_ddr.

In this simplified design, the DDR frequency may comprise a fixed value regardless of the plurality of memory client bandwidth requirements and cache hit rates. The fixed value may be selected from a set of predefined frequencies assuming worst case cache hit rate and concurrent condition.

It should be appreciated that the DDR subsystem 122 may adjust memory access patterns to the DRAM 104 based on, for example, the cache hit rates of the plurality of memory clients, the DDR operating frequency, and the clients' access pattern. Referring to FIG. 3, in one embodiment, the DDR subsystem 122 may adjust the system cache prefetch size based on one or more use cases. Table 300 illustrates three exemplary use cases in column 302. A first use case 310 comprises camera use case. A second use case 312 comprises a GPU use case. A third use case comprises a CPU use case. The use case man be identified by means of sub-cache partition, or by a master ID from each transaction. The DDR subsystem 122 can then prefetch based on the use case's traffic pattern. Columns 304, 306, and 308 illustrate corresponding values for a prefetch weighting, an access pattern, and a delay tolerance, respectively. It should be appreciated that these may be configurable parameters in the DDR subsystem 122, which may be set to a pre-tuned value for each use case. The prefetch weighting value comprises a value that represents how aggressive the prefetch is to be applied to a cache prefetch function when an access pattern is detected (e.g., the value "0" being the least aggressive and a value "10" being the most aggressive).

The access pattern 306 (FIG. 3) defines the traffic request pattern from the corresponding use case. This represents the pattern used to detect and enable the prefetch, and the pattern that will be used to prefetch data. For a camera use case 310, the prefetch pattern is for every 256 bytes address granule (i.e., prefetch the first 64 bytes, skip the next 192 bytes, then prefetch the first 64 bytes from the next 256 bytes unit). The delay tolerance 308 represents how long a timing window the use case can handle for a request to get a response. This information may be helpful in guiding the DDR subsystem 122 (e.g., controlling how much it can hold off the I/O request toward the DRAM, and keep the DRAM and I/O in low power state as long as possible). Once a prefetch action is needed for a use case, the prefetch size for that use case may be determined according to Equation 3.

$$\text{Prefetch\_size}\_n = \text{Size\_pfch\_max} * Wn * (F\_ddr\_\max - F\_ddr) / ((F\_ddr\_\max - F\_ddr\_\min) * 10) \quad \text{Equation 3}$$

For each client "n", Wn is the relative importance or weight of that client, measured in a percentage. For example, a larger value of Wn would cause that client to have a greater influence on the prefetch length compared to other clients with a lower value of Wn. "Size_pfch_max" is the programmable maximum prefetch size to be issued from the DDR subsystem 122. "Prefetch_size_n" is the prefetched size for a use case in a particular use case, which may be based on, for example, the minimum granularity of cache operation.

In another embodiment, the DDR subsystem 122 may adjust the system cache prefetch size based on the DDR frequency. For example, the prefetch size may be increased to mitigate latency when DRAM 104 is at a relatively lower frequency. The prefetch function may be disabled when the DDR frequency reaches a predetermined or programmable threshold. Furthermore, the DDR subsystem 122 may preconfigure the prefetch size according to, for example, a minimum size (e.g., 256 bytes) and a maximum size (e.g., 4 Kbytes). The DDR subsystem 122 may control the prefetch size based on traffic patterns, the DDR frequency and prefetch hit rate.

In a further embodiment, the DDR subsystem 122 may adjust the system cache prefetch size the cache hit rates of the memory clients. The DDR subsystem 122 may keep track of the cache lines that are allocated by the prefetch engine. When monitoring use case hit rate, the DDR subsystem 122 may provide a separate counter for the cache lines allocated by prefetch and non-prefetch. The prefetch size may be increased when the cache hit rate on prefetched lines increases.

Figure 4:
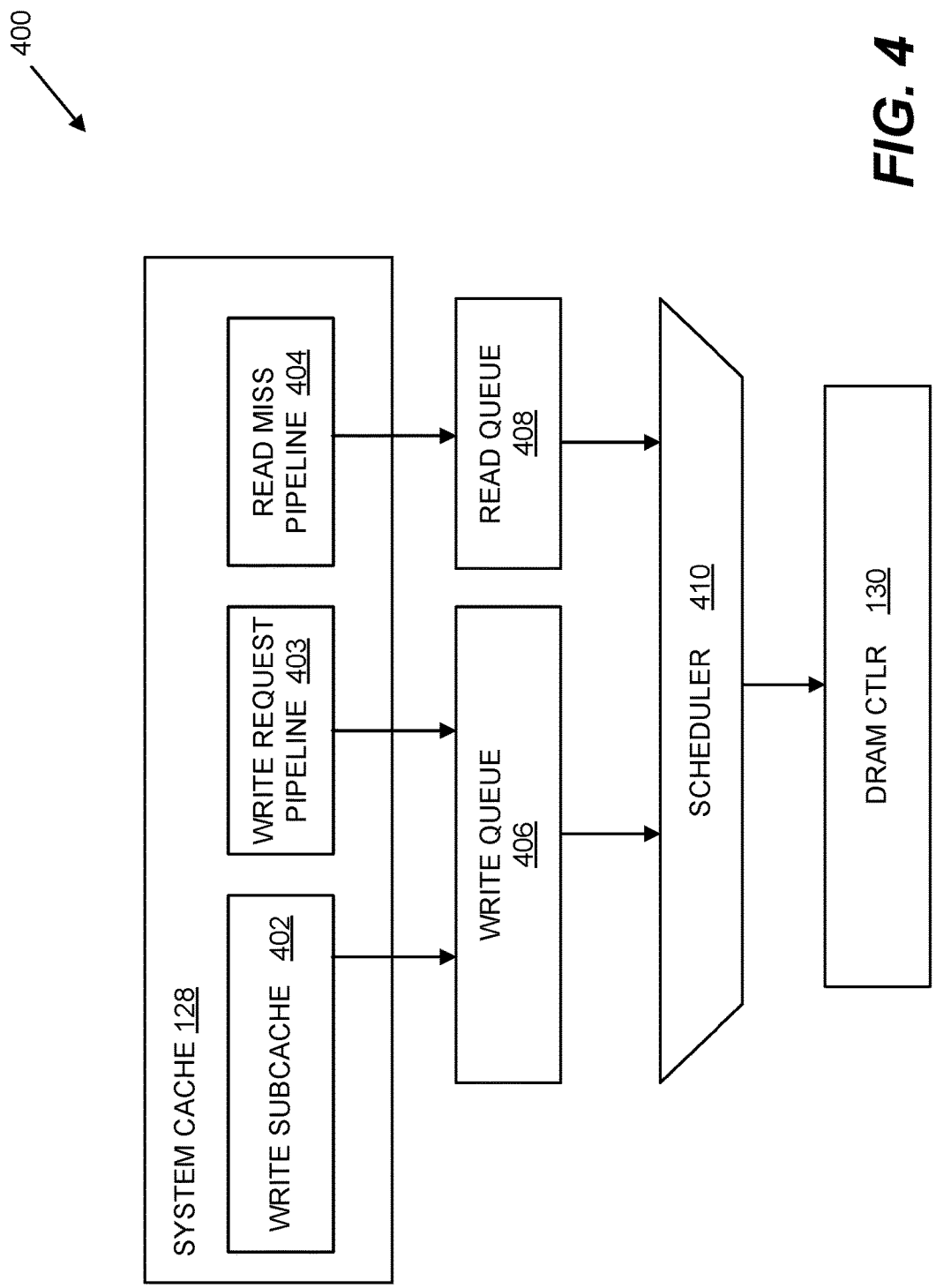
FIG. 4 is a combined block/flow diagram illustrating an embodiment of the system cache in the DDR subsystem of FIG. 1.

FIG. 4 is a combined block/flow diagram illustrating an embodiment of the system cache 128. The system cache 128 comprises a write subcache 402 (e.g., an exemplary write buffer 132), a write request pipeline 403, and a read miss pipeline 404. The write subcache 402 and the write request pipeline 403 are coupled to a write queue 406. The read miss block 404 is coupled to a read queue 408. The write queue 406 and the read queue 408 communicate with a memory scheduler 410, which is coupled to the DRAM controller 130. It should be appreciated that FIG. 4 illustrates the flow within one frequency point. In the case when DRAM 104 only supports one frequency point, the DRAM 104 may be switch between an active mode and a self-refresh mode. The DRAM controller 130 can switch between clock gated and non-gated operation.

Figure 5:
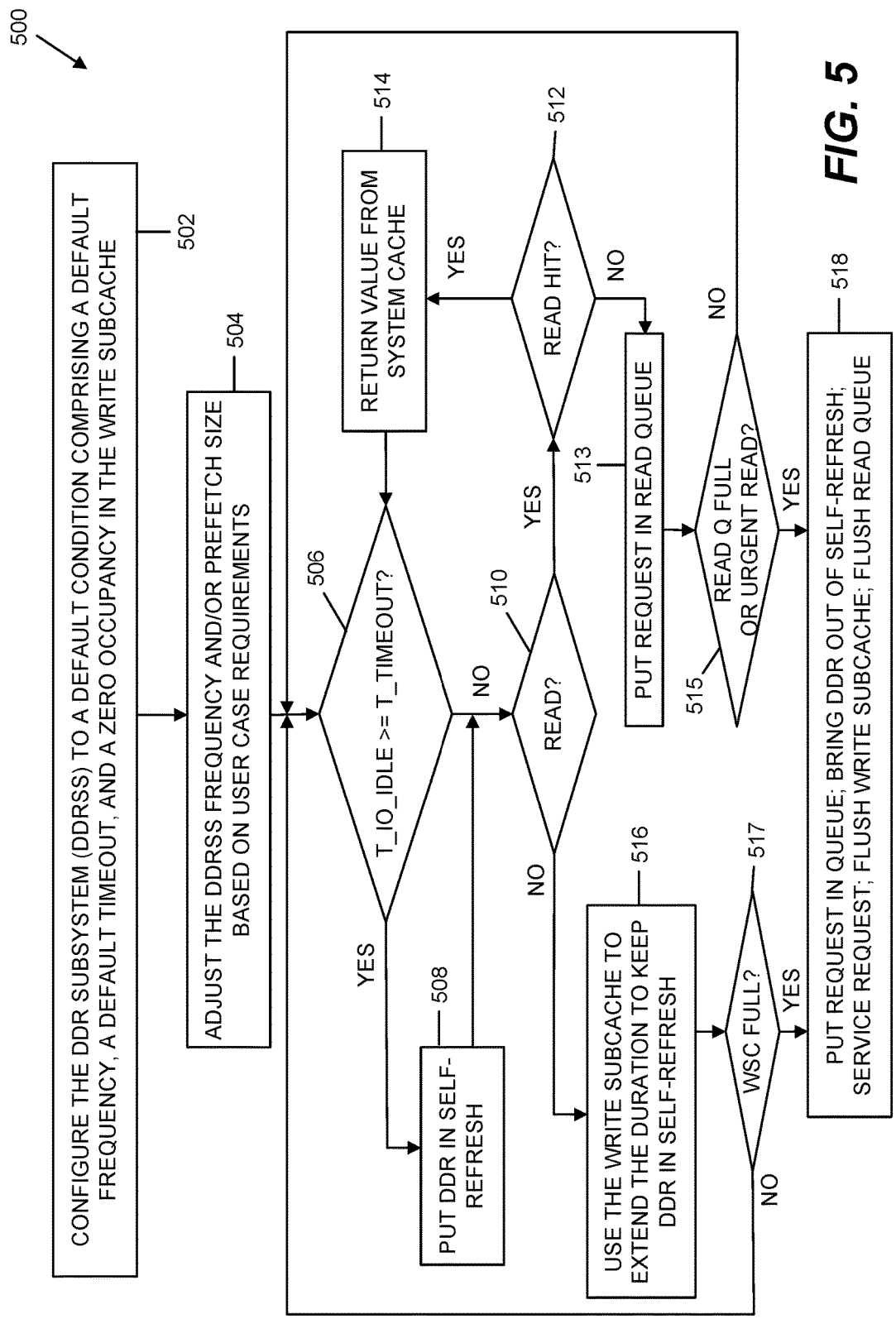
FIG. 5 is a flowchart illustrating an embodiment of the operation of the write subcache in the system cache of FIG. 4.

FIG. 5 illustrates a method 500 implemented in the system 400 of FIG. 4. During boot, at block 502, the DDR subsystem 122 may be configured to a default condition comprising a default frequency and a default timeout The default condition may have a zero occupancy in the write subcache 402. At block 504, the DDR subsystem 122 may adjust the DDR frequency and/or prefetch size based on use case requirements. At blocks 506 and 508, a timer may be used to put the DRAM 104 into the self-refresh mode when there is a lack of read/write activity. At block 516, for a write request, the write subcache 402 may be used to extend the duration to keep DRAM 104 in the self-refresh mode to conserve power. The write request may be waiting in the write queue until the queue is full, and then the requests may be sent out together. At blocks 510, 512, and 514, the system 400 may service a read request from the system cache 128 if there is a cache hit. Upon a read miss, the request may be temporarily put in a read request queue. In order to aggregate the read access, the request may be waiting in the queue until the queue is full, and then the read requests may be sent out together. It should be appreciated, however, that when the request has, for example, a QoS priority higher than a configurable threshold, the request may be serviced without waiting in the read queue. At block 518, the DRAM 104 may be brought out of the self-refresh mode to service the request, such as a read miss, or when the write subcache 402 can no longer host the write request, the requests in the read queue and the write queue may be flushed out.

Figure 6:
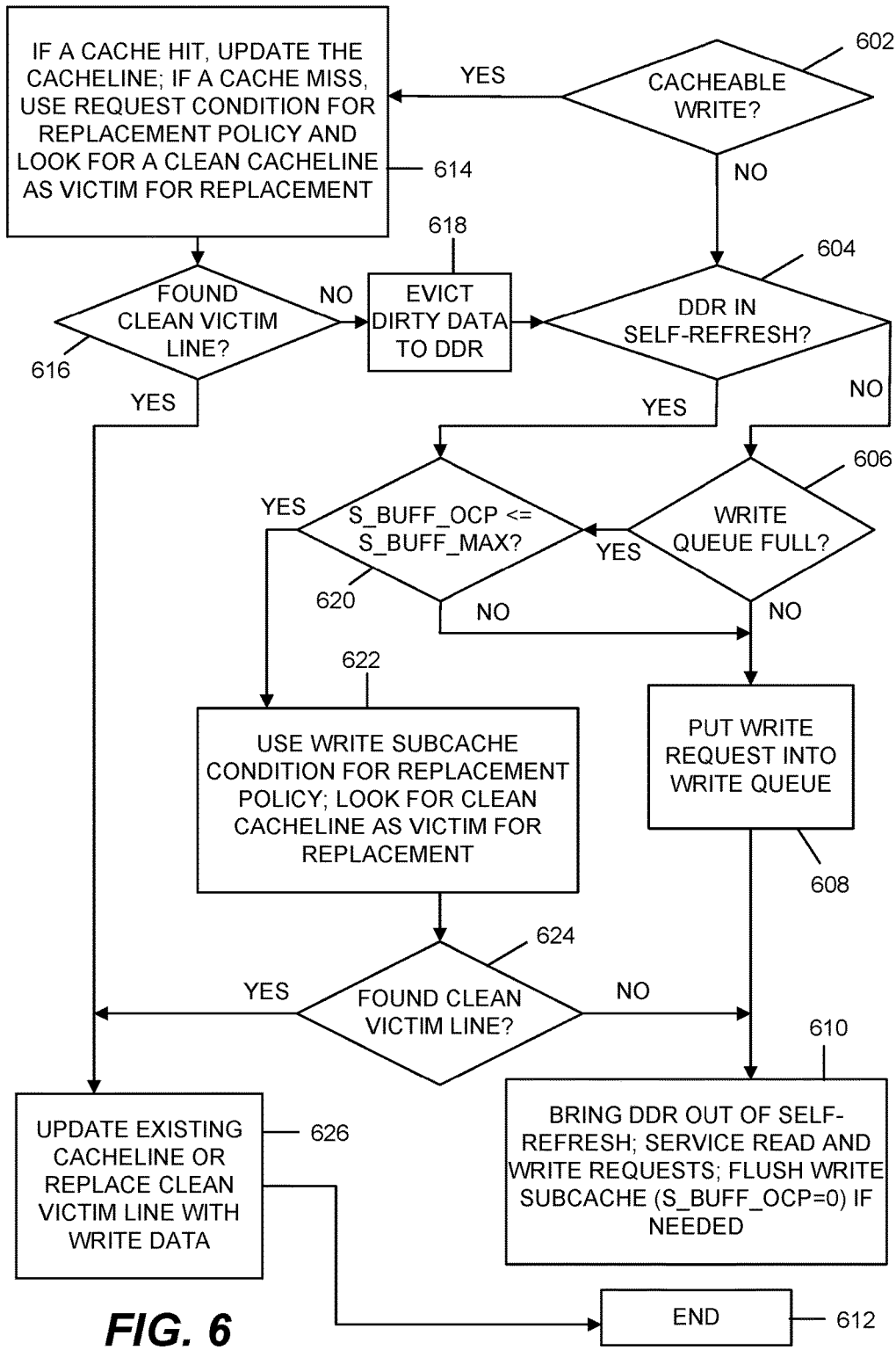
FIG. 6 is a flowchart illustrating another embodiment of the operation of the write subcache in the system cache of FIG. 4.

FIG. 6 is a flowchart illustrating another embodiment of the operation of the system cache 128. FIG. 6 shows the detail within one frequency point or, in the case when DRAM 104 only supports one frequency point, how the write request is serviced to keep DRAM 104 in the self-refresh mode for as long as practical. The write subcache 402 comprises a system cache partition. The cache lines that are not used as write subcache 402 can be used as normal cache for use cases. Blocks 602, 604, 606, 608, and 610 illustrate a non-cacheable request being received when DRAM 104 is in the active mode or in self-refresh. If the write queue 406 is not full, the request may be put in the queue to be scheduled for DDR I/O. If DRAM 104 is in the self-refresh mode or the queue is full, it will check the write subcache 402 at decision block 620. A cacheable write request may be processed through a normal cache operation, which may have different operation condition than the write buffer subcache. At blocks 614, 616, and 626, the system determines if there is a cache hit or other cache lines need to be replaced. At block 618, if there is a cache miss and the victim is a dirty line, it goes to the same path above to decide whether to send the request to write subcache 402 or directly to the write queue 406. Blocks 620, 622, 624, and 626 show the flow to allocate a cache line in the system cache 128 as write subcache 402 to temporarily buffer the data before it is written to DRAM 104. At blocks 620 and 624, when the buffer is full or no more appropriate cache lines are available to be allocated for write subcache 402, the DRAM 104 is brought out of the self-refresh mode.

Figure 7:
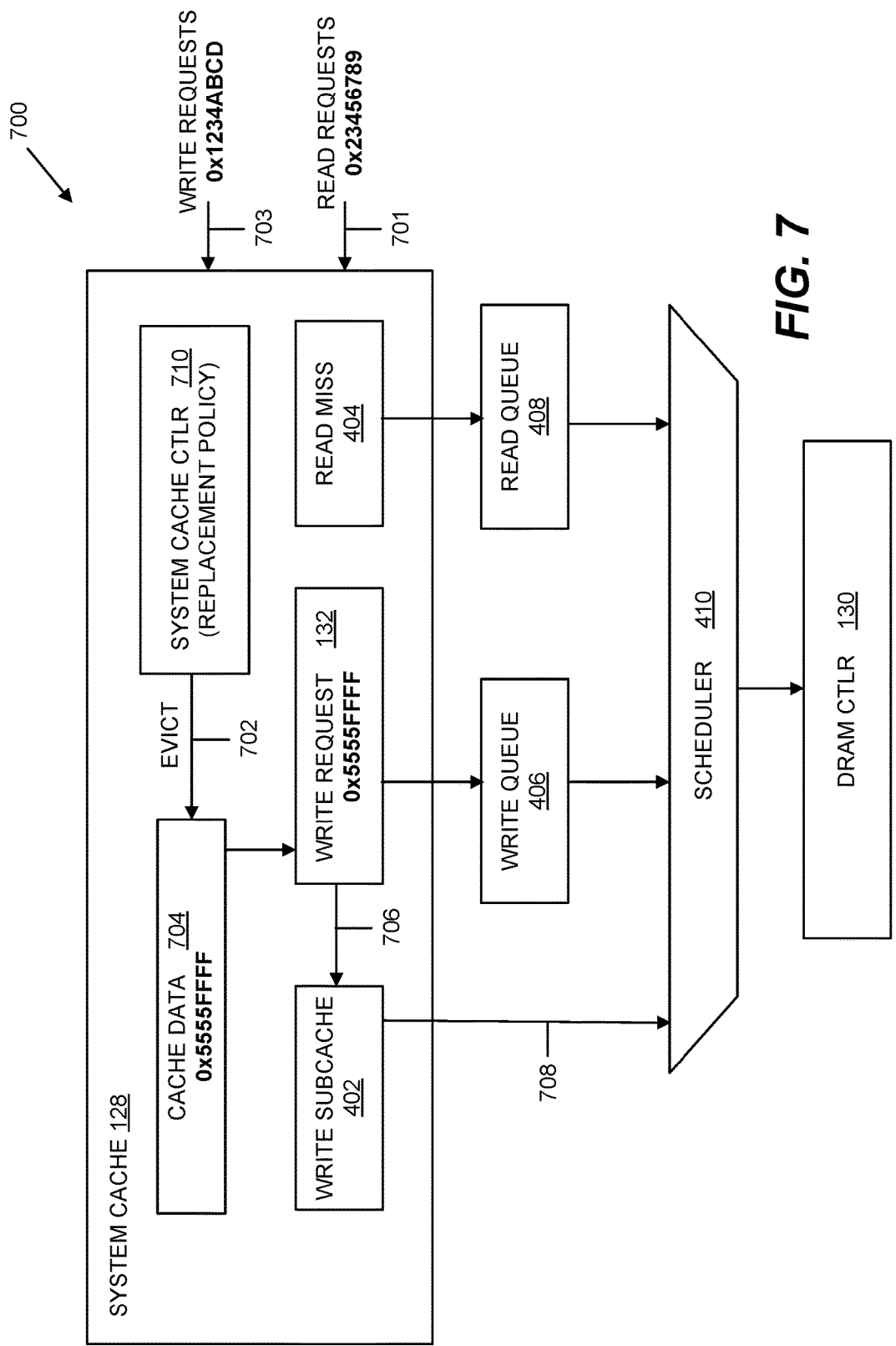
FIG. 7 is a combined block/flow diagram illustrating an embodiment of the operation of a QoS algorithm implemented in the scheduler of FIG. 4.

FIG. 7 is a combined block/flow diagram illustrating an embodiment of the operation of a QoS algorithm implemented in the scheduler of FIG. 4. As illustrated in FIG. 7, read requests 701 and write requests 703 may reach the DDR subsystem 122 with a QoS indication, such as, a priority level. The requests may be serviced from the system cache 128, in which case a transaction to the DDR I/O is not generated. If there is a miss, the request is forwarded to the DDR IO. The request may be allocated in the system cache 128. A dirty cache line may be evicted (line 702) to a different address to the DDR I/O. Therefore, the address of the incoming request to the DDR subsystem 122 may not be exactly the address on the DDR I/O. The address in the incoming read/write requests 701 and 703 may not be the right information to be used for scheduling the traffic toward the DRAM CTLR 130. In this example, the system cache controller 710 receives the write request 703 with address 0x1234ABCD. The system cache controller 710 may determines that a new cache line will be allocated for this write request. As illustrated at line 702, the system cache controller 710 may select a victim cache line to be evicted according to the replacement policy. Block 704 shows the victim cache line with an address different than the original write request (e.g., 0x5555FFFF is going to be evicted to DDR). At block 132, the eviction generates a write request for the address 0x5555FFFF. The request is either put into the write queue 406 if the queue is not full, or put into the write subcache 402. Because of the write subcache, the DDR traffic scheduler 410 now has a bigger pool to be scheduled, including, for example, the following: (a) all the requests in the read queue with the QoS priority level of the request; (b) all the requests in the read queue with the QoS priority level of the request; and (c) all the requests in the write buffer. Having visibility of more incoming traffic allows the scheduler for better scheduling, with the scheduling criteria considering the request's QoS priority level, DRAM page open and bank hit, read priority over write priority, etc., and send the request to the DRAM controller 130. In this manner, it should be appreciated that system can have better QoS and DDR utilization by providing the scheduler with bigger pool for scheduling.

Figure 8:
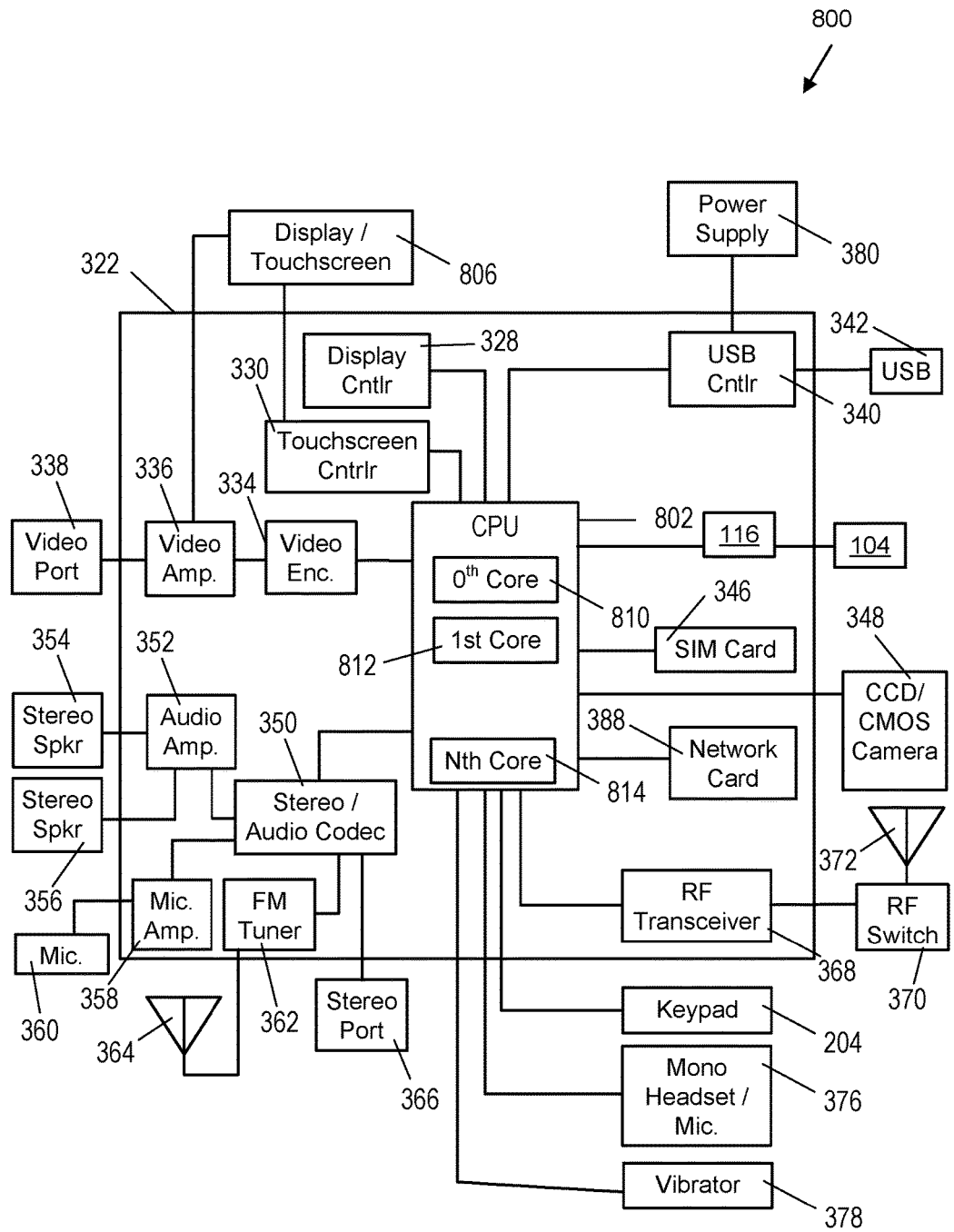
FIG. 8 is a block diagram of an embodiment of a portable communication device for incorporating the system of FIG. 1.

As mentioned above, the system 100 may be incorporated into any desirable computing system. FIG. 8 illustrates the system 100 incorporated in an exemplary portable computing device (PCD) 800. It will be readily appreciated that certain components of the system 100 (e.g., RPM 116) are included on the SoC 322 (FIG. 8) while other components (e.g., the DRAM 104) are external components coupled to the SoC 322. The SoC 322 may include a multicore CPU 802. The multicore CPU 802 may include a zeroth core 810, a first core 812, and an Nth core 814. One of the cores may comprise, for example, a graphics processing unit (GPU) with one or more of the others comprising the CPU.

A display controller 328 and a touch screen controller 330 may be coupled to the CPU 802. In turn, the touch screen display 606 external to the on-chip system 322 may be coupled to the display controller 328 and the touch screen controller 330.

FIG. 8 further shows that a video encoder 334, e.g., a phase alternating line (PAL) encoder, a sequential color a memoire (SECAM) encoder, or a national television system(s) committee (NTSC) encoder, is coupled to the multicore CPU 802. Further, a video amplifier 336 is coupled to the video encoder 334 and the touch screen display 806. Also, a video port 338 is coupled to the video amplifier 336. As shown in FIG. 8, a universal serial bus (USB) controller 340 is coupled to the multicore CPU 802. Also, a USB port 342 is coupled to the USB controller 340. Memory 104 and a subscriber identity module (SIM) card 346 may also be coupled to the multicore CPU 802.

Further, as shown in FIG. 8, a digital camera 348 may be coupled to the multicore CPU 802. In an exemplary aspect, the digital camera 348 is a charge-coupled device (CCD) camera or a complementary metal-oxide semiconductor (CMOS) camera.

As further illustrated in FIG. 8, a stereo audio coder-decoder (CODEC) 350 may be coupled to the multicore CPU 802. Moreover, an audio amplifier 352 may be coupled to the stereo audio CODEC 350. In an exemplary aspect, a first stereo speaker 354 and a second stereo speaker 356 are coupled to the audio amplifier 352. FIG. 8 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 8 further illustrates that a radio frequency (RF) transceiver 368 may be coupled to the multicore CPU 802. An RF switch 370 may be coupled to the RF transceiver 368 and an RF antenna 372. A keypad 204 may be coupled to the multicore CPU 802. Also, a mono headset with a microphone 376 may be coupled to the multicore CPU 802. Further, a vibrator device 378 may be coupled to the multicore CPU 802.

FIG. 8 also shows that a power supply 380 may be coupled to the on-chip system 322. In a particular aspect, the power supply 380 is a direct current (DC) power supply that provides power to the various components of the PCD 800 that require power. Further, in a particular aspect, the power supply is a rechargeable DC battery or a DC power supply that is derived from an alternating current (AC) to DC transformer that is connected to an AC power source.

FIG. 8 further indicates that the PCD 800 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 8, the touch screen display 806, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for reducing memory subsystem power, the method comprising:
 a system resource manager providing memory performance requirements for a plurality of memory clients to a double data rate (DDR) subsystem, the DDR subsystem and the system resource manager residing on a system on chip electrically coupled to a dynamic random access memory (DRAM);
 determining a cache hit rate of each of the plurality of memory clients associated with a system cache residing on the DDR subsystem; and
 the DDR subsystem adjusting access to the DRAM based on the memory performance requirements received from the system resource manager and the cache hit rates of the plurality of memory clients.

2. The method of claim 1, wherein the DDR subsystem adjusting access to the DRAM comprises: adjusting a system cache prefetch size based on a DDR clock frequency.

3. The method of claim 2, wherein the DDR subsystem adjusting access to the DRAM comprises: increasing a system cache prefetch size to mitigate latency when the DDR clock frequency reaches a programmable threshold.

4. The method of claim 1, wherein the DDR subsystem adjusting access to the DRAM comprises: adjusting a system cache prefetch sized based the cache hit rate of at least one of the plurality of memory clients.

5. The method of claim 1, further comprising:
 instructing the DRAM to enter a self-refresh mode; and
 extending a duration of the self-refresh mode by using a write subcache residing in the system cache.

6. The method of claim 1, wherein the memory clients comprise one or more of a central processing unit (CPU), a graphics processing unit (GPU), and a digital signal processor (DSP) electrically coupled via a SoC bus.

7. The method of claim 1, wherein the DDR subsystem further comprises one or more performance monitors for determining the cache hit rates of each of the plurality of memory clients.

8. A system for reducing memory subsystem power, the system comprising:
 means for providing memory performance requirements for a plurality of memory clients to a double data rate (DDR) subsystem, the DDR subsystem residing on a system on chip (SoC) electrically coupled to a dynamic random access memory (DRAM);
 means for determining a cache hit rate of each of the plurality of memory clients associated with a system cache residing on the DDR subsystem; and
 means for adjusting access to the DRAM based on the memory performance requirements received from the system resource manager and the cache hit rates of the plurality of memory clients.

9. The system of claim 8, wherein the means for adjusting access to the DRAM comprises: means for adjusting a system cache prefetch size based on a DDR clock frequency.

10. The system of claim 9, wherein the means for adjusting access to the DRAM comprises: means for increasing a system cache prefetch size to mitigate latency when the DDR clock frequency reaches a programmable threshold.

11. The system of claim 8, wherein the means for adjusting access to the DRAM comprises: means for adjusting a system cache prefetch sized based the cache hit rate of at least one of the plurality of memory clients.

12. The system of claim 8, further comprising:
 means for placing the DRAM in a self-refresh mode; and
 means for extending a duration of the self-refresh mode by using a write subcache residing in the system cache.

13. The system of claim 8, wherein the memory clients comprise one or more of a central processing unit (CPU), a graphics processing unit (GPU), and a digital signal processor (DSP) electrically coupled via a SoC bus.

14. The system of claim 8, wherein the DDR subsystem further comprises one or more performance monitors for determining the cache hit rates of each of the plurality of memory clients.

15. A computer program embodied in a memory and executable by a processor for implementing a method for reducing memory subsystem power, the method comprising:
 providing memory performance requirements for a plurality of memory clients to a double data rate (DDR) subsystem, the DDR subsystem residing on a system on chip (SoC) electrically coupled to a dynamic random access memory (DRAM);
 determining a cache hit rate of each of the plurality of memory clients associated with a system cache residing on the DDR subsystem; and
 adjusting access to the DRAM based on the memory performance requirements received from the system resource manager and the cache hit rates of the plurality of memory clients.

16. The computer program of claim 15, wherein the adjusting access to the DRAM comprises: adjusting a system cache prefetch size based on a DDR clock frequency.

17. The computer program of claim 15, wherein the adjusting access to the DRAM comprises: increasing a system cache prefetch size to mitigate latency when the DDR clock frequency reaches a programmable threshold.

18. The computer program of claim 15, wherein the adjusting access to the DRAM comprises: adjusting a system cache prefetch sized based the cache hit rate of at least one of the plurality of memory clients.

19. The computer program of claim 15, wherein the method further comprises:
 instructing the DRAM to enter a self-refresh mode; and
 extending a duration of the self-refresh mode by using a write subcache residing in the system cache.

20. The computer program of claim 15, wherein the memory clients comprise one or more of a central processing unit (CPU), a graphics processing unit (GPU), and a digital signal processor (DSP) electrically coupled via a SoC bus.

21. The computer program of claim 15, wherein the DDR subsystem further comprises one or more performance monitors for determining the cache hit rates of each of the plurality of memory clients.

22. A system for reducing memory subsystem power, the system comprising:
 a dynamic random access memory (DRAM); and
 a system on chip (SoC) electrically coupled to the DRAM via a DDR bus, the SoC comprising:
  a plurality of memory clients electrically coupled via a SoC bus;
  a system resource manager configured to determine memory performance requirements for the plurality of memory clients;

a DDR subsystem comprising a system cache, the DDR subsystem configured to: determine a cache hit rate of each of the plurality of memory clients associated with the system cache; and adjust access to the DRAM based on the memory performance requirements received from the system resource manager and the cache hit rates of the plurality of memory clients.

23. The system of claim 22, wherein the DDR subsystem adjusts access to the DRAM by adjusting a system cache prefetch size based on a DDR clock frequency.

24. The system of claim 23, wherein the DDR subsystem adjusts access to the DRAM by increasing a system cache prefetch size to mitigate latency when the DDR clock frequency reaches a programmable threshold.

25. The system of claim 22, wherein the DDR subsystem adjusts access to the DRAM comprises by adjusting a system cache prefetch sized based the cache hit rate of at least one of the plurality of memory clients.

26. The system of claim 22, wherein the DDR subsystem is further configured to:
  instruct the DRAM to enter a self-refresh mode; and
  extend a duration of the self-refresh mode by using a write subcache residing in the system cache.

27. The system of claim 22, wherein the memory clients comprise one or more of a central processing unit (CPU), a graphics processing unit (GPU), and a digital signal processor (DSP) electrically coupled via a SoC bus.

28. The system of claim 22, wherein the DDR subsystem further comprises one or more performance monitors for determining the cache hit rates of each of the plurality of memory clients.

29. The system of claim 22 incorporated in a portable computing device.

30. The system of claim 29, wherein the portable computing device comprises a smartphone or a tablet.

* * * * *